(12) United States Patent
Smith et al.

(10) Patent No.: US 10,394,388 B2
(45) Date of Patent: Aug. 27, 2019

(54) ADAPTIVE REFLECTED LIGHT TOUCH SENSOR

(71) Applicant: MICRO MOTION, INC., Boulder, CO (US)

(72) Inventors: Brian T Smith, Johnstown, CO (US); Chris E. Eyre, Longmont, CO (US)

(73) Assignee: Micro Motion, Inc., Boulder, CO (US)

( * ) Notice: Subject to any disclaimer, the term of this patent is extended or adjusted under 35 U.S.C. 154(b) by 0 days.

(21) Appl. No.: 15/307,991

(22) PCT Filed: May 29, 2014

(86) PCT No.: PCT/US2014/040016
§ 371 (c)(1),
(2) Date: Oct. 31, 2016

(87) PCT Pub. No.: WO2015/183285
PCT Pub. Date: Dec. 3, 2015

(65) Prior Publication Data
US 2017/0060345 A1    Mar. 2, 2017

(51) Int. Cl.
*G06F 3/042* (2006.01)
*H03K 17/96* (2006.01)
*G06F 3/041* (2006.01)

(52) U.S. Cl.
CPC .......... *G06F 3/0421* (2013.01); *G06F 3/0416* (2013.01); *H03K 17/9627* (2013.01); *H03K 17/9631* (2013.01); *H03K 17/9638* (2013.01); *H03K 2217/94026* (2013.01); *H03K 2217/94108* (2013.01)

(58) Field of Classification Search
CPC . G06F 3/0421; G06F 3/0416; H03K 17/9627; H03K 17/9631; H03K 17/9638; H03K 2217/94026; H03K 2217/94108
See application file for complete search history.

(56) References Cited

U.S. PATENT DOCUMENTS

| | | | |
|---|---|---|---|
| 7,486,386 B1 | 2/2009 | Holcombe et al. | |
| 8,040,142 B1 | 10/2011 | Bokma et al. | |
| 2002/0052209 A1* | 5/2002 | Frohlund | G06F 3/0421 455/456.6 |
| 2005/0168134 A1* | 8/2005 | Nishikawa | G06F 3/0421 313/500 |

(Continued)

FOREIGN PATENT DOCUMENTS

| | | |
|---|---|---|
| DE | 19547300 C1 | 3/1997 |
| GB | 2161266 A | 1/1986 |

(Continued)

*Primary Examiner* — Sejoon Ahn
(74) *Attorney, Agent, or Firm* — The Ollila Law Group LLC

(57) ABSTRACT

An adaptive reflected light touch sensor (100, 400) is provided. The adaptive reflected light touch sensor (100, 400) includes an emitter (110) that emits light in a direction that reflects the light (RLI, RLO), a sensor (120, 410) positioned to measure a light amplitude of the reflected light (RLI, RLO), a processor board (150) coupled to the sensor (120, 410), the processor board (150) being configured to calculate a moving average of the measured light amplitude of the reflected light (RLI, RLO) and calculate an assert threshold.

13 Claims, 7 Drawing Sheets

(56) References Cited

U.S. PATENT DOCUMENTS

| | | | |
|---|---|---|---|
| 2005/0253643 A1* | 11/2005 | Inokawa | G06F 3/016 |
| | | | 327/517 |
| 2006/0227115 A1 | 10/2006 | Fry | |
| 2008/0290929 A1* | 11/2008 | O'Dowd | H03K 17/945 |
| | | | 327/517 |
| 2009/0039239 A1 | 2/2009 | Amoriza Berasaluce et al. | |
| 2010/0036629 A1 | 2/2010 | Semmelrodt | |
| 2010/0141410 A1* | 6/2010 | Aono | G06F 3/016 |
| | | | 340/407.2 |
| 2011/0163984 A1* | 7/2011 | Aono | G06F 3/016 |
| | | | 345/173 |
| 2012/0327002 A1 | 12/2012 | Philippe | |
| 2013/0155027 A1* | 6/2013 | Holmgren | G06F 3/0421 |
| | | | 345/175 |
| 2013/0187891 A1* | 7/2013 | Eriksson | G06F 3/0421 |
| | | | 345/175 |
| 2014/0049885 A1* | 2/2014 | Chen | H05K 7/00 |
| | | | 361/679.01 |
| 2015/0204979 A1* | 7/2015 | Naess | G01S 5/16 |
| | | | 356/614 |

FOREIGN PATENT DOCUMENTS

| | | |
|---|---|---|
| JP | 2003087107 A | 3/2003 |
| WO | 8601953 A1 | 3/1986 |
| WO | 2007006330 A1 | 1/2007 |

\* cited by examiner

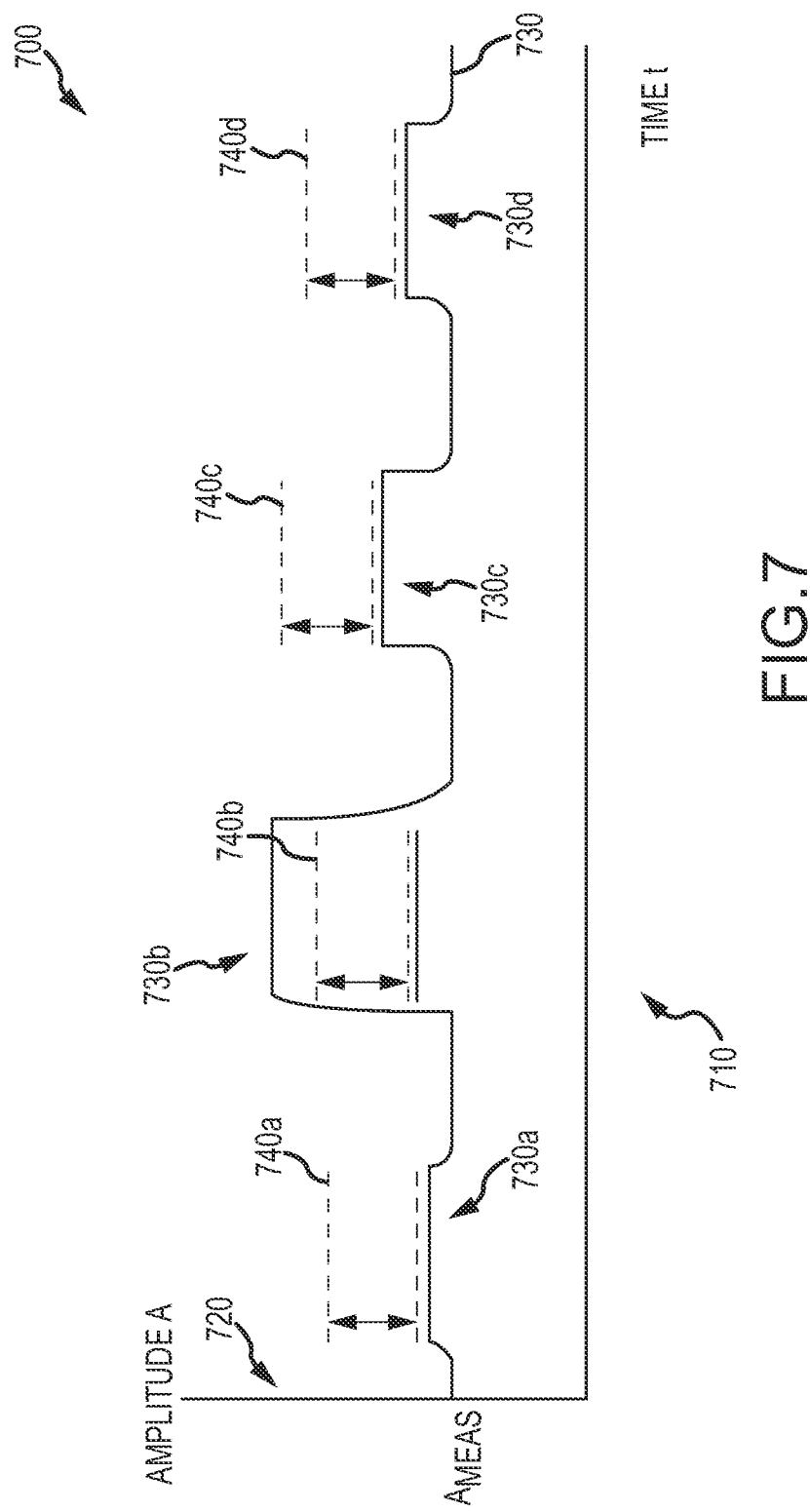

ADAPTIVE REFLECTED LIGHT TOUCH SENSOR

TECHNICAL FIELD

The embodiments described below relate to, touch sensors, and more particularly, to adaptive reflected light touch sensors.

BACKGROUND

Instruments are used in industrial applications to control processes. For example, instruments can be used to measure characteristics of materials flowing through a pipeline, processes running in a chamber, monitor environmental conditions, etc. The instruments can provide data of the measurements through, for example, an interface that is accessible by an operator. Using the data provided by the instruments, other devices such as valves, pumps, motors, or the like can be operated to control other processes. The data can also be used for analysis, sorting the fluid, compensating for environmental conditions, or the like.

The instrument can be employed in various industrial applications and settings. As a result, the instrument is often required to meet a wide range of environmental specifications. For example, the instrument may be required to reliably function in high humidity while being subjected to temperature cycles or corrosive environments. The instrument might also be required to accept data input in these environments. For example, an operator working on the pipeline may be required to input data into the instrument under various environmental conditions. To input the data, the operator typically presses buttons on an interface.

The buttons can be comprised of infrared buttons with light sensors that detect changes in light intensity due to the presence of an object, such as a finger. The infrared buttons are typically calibrated to operate in both high and low temperature environments. However, the calibration routines are typically done with standards that do not necessarily include tolerances that are found in the interface. For example, a standard distance of the finger from a standard intensity light beam is sometimes employed. As a result, tolerance stack-ups and product-to-product variations can introduce errors in the data input through prior art buttons. In addition, the stack-ups and variations can cause the buttons to feel inconsistent to the operator, which can also introduce data errors or cause delays in the data entry.

Although the reliability of the touch sensors can be improved by configuring the touch sensors for specific products, such custom configurations are expensive and prone to introducing additional defects into the product. Accordingly, there is a need for an interface with an adaptive reflected light touch sensor.

SUMMARY

An adaptive reflected light touch sensor is provided. According to an embodiment, the adaptive reflected light touch sensor comprises an emitter that emits light in a direction that reflects the light, a sensor positioned to measure a light amplitude of the reflected light, and a processor board coupled to the sensor. Further, the processor board is configured to calculate a moving average of the measured light amplitude of the reflected light and calculate an assert threshold.

A method for configuring an adaptive reflected light touch sensor is provided. According to an embodiment, the method comprises emitting light from an emitter, reflecting the light, and measuring a light amplitude of the reflected light with a sensor. The method further comprises calculating a moving average of the measured amplitude of the reflected light and calculating an assert threshold.

An interface comprising two or more adaptive reflected light touch sensors is provided. According to an embodiment, each of the two or more adaptive reflected light touch sensors comprises an emitter that emits light in a direction that reflects the light and a sensor positioned to measure a light amplitude of the reflected light. The interface further comprises a processor board coupled to the two or more sensors and configured to calculate a moving average of the measured light amplitude of the reflected light and calculate an assert threshold. The processor board independently calculates the moving average of the measured light amplitude for each of the two or more adaptive reflected light touch sensors.

ASPECTS

According to an aspect, an adaptive reflected light touch sensor (100, 400) comprises an emitter (110) that emits light in a direction that reflects the light (RLI, RLO), a sensor (120, 410) positioned to measure a light amplitude of the reflected light (RLI, RLO), a processor board (150) coupled to the sensor (120, 410), the processor board (150) being configured to calculate a moving average of the measured light amplitude of the reflected light (RLI, RLO), and calculate an assert threshold.

Preferably, the processor board (150) is further configured to increment an assert count if the measured light amplitude is greater than the assert threshold and reset an averaging period of the moving average.

Preferably, the processor board (150) is further configured to detect a button press and decrease a press threshold to implement button hysteresis.

Preferably, the adaptive reflected light touch sensor (100, 400) further comprises a window (140) positioned to reflect the light (RLI, RLO).

Preferably, the reflected light (RLI, RLO) is reflected from an outer surface (140o) and an inner surface (140i) of the window (140).

Preferably, the window (140) comprises glass.

Preferably, the adaptive reflected light touch sensor (100, 400) further comprises a gap that is formed by an inner surface (140i) of the window (140) and an outer surface of a bezel (13).

Preferably, the adaptive reflected light touch sensor (100, 400) further comprises a light guide (130) that directs the reflected light (RLI, RLO) towards the sensor (120).

Preferably, the light is infrared light.

According to an aspect, a method (500) for configuring an adaptive reflected light touch sensor (100, 400) comprises emitting light from an emitter (110), reflecting the light, measuring a light amplitude of the reflected light (RLI, RLO) with a sensor (120, 410), calculating a moving average of the measured amplitude of the reflected light (RLI, RLO), and calculating an assert threshold.

Preferably, the method (500) for configuring the adaptive reflected light touch sensor (100, 400) further comprises incrementing an assert count if the measured light amplitude of the reflected light (RLI, RLO) is greater than the assert threshold and resetting an averaging period of the moving average.

Preferably, the method (500) for configuring the adaptive reflected light touch sensor (100, 400) further comprises detecting a button press and decreasing a press threshold to implement button hysteresis.

Preferably, reflecting the light comprises reflecting the light with a window (140).

Preferably, reflecting the light with the window (140) comprises reflecting the light with an outer surface (140o) and an inner surface (140i) of the window (140).

Preferably, the window (140) is comprised of glass.

Preferably, the method (500) for configuring the adaptive reflected light touch sensor (100, 400) further comprises reflecting the light through a gap that is formed by an inner surface (140i) of the window (140) and an outer surface of a bezel (13).

Preferably, the method (500) for configuring the adaptive reflected light touch sensor (100, 400) further comprises directing the reflected light (RLI, RLO) towards the sensor (120, 410) with a light guide (130).

Preferably, the light is infrared light.

According to an aspect, an interface (10) comprises two or more adaptive reflected light touch sensors (100, 400), each of the two or more adaptive reflected light touch sensors comprising an emitter (110) that emits light in a direction that reflects the light (RLI, RLO); and a sensor (120, 410) positioned to measure a light amplitude of the reflected light (RLI, RLO), and a processor board (150) coupled to the two or more sensors (120, 410), the processor board (150) being configured to calculate a moving average of the measured light amplitude of the reflected light (RLI, RLO) and calculate an assert threshold, wherein the processor board (150) independently calculates the moving average of the measured light amplitude for each of the two or more adaptive reflected light touch sensors (100, 400).

BRIEF DESCRIPTION OF THE DRAWINGS

The same reference number represents the same element on all drawings. It should be understood that the drawings are not necessarily to scale.

FIG. 7 shows a graph 700 with a time t axis 710 and an amplitude A axis 720 and a waveform 730.

DETAILED DESCRIPTION

FIGS. 1-7 and the following description depict specific examples to teach those skilled in the art how to make and use the best mode of embodiments of an adaptive reflected light touch sensor. For the purpose of teaching inventive principles, some conventional aspects have been simplified or omitted. Those skilled in the art will appreciate variations from these examples that fall within the scope of the present description. Those skilled in the art will appreciate that the features described below can be combined in various ways to form multiple variations of the adaptive reflected light touch sensor. As a result, the embodiments described below are not limited to the specific examples described below, but only by the claims and their equivalents.

Figure 1:
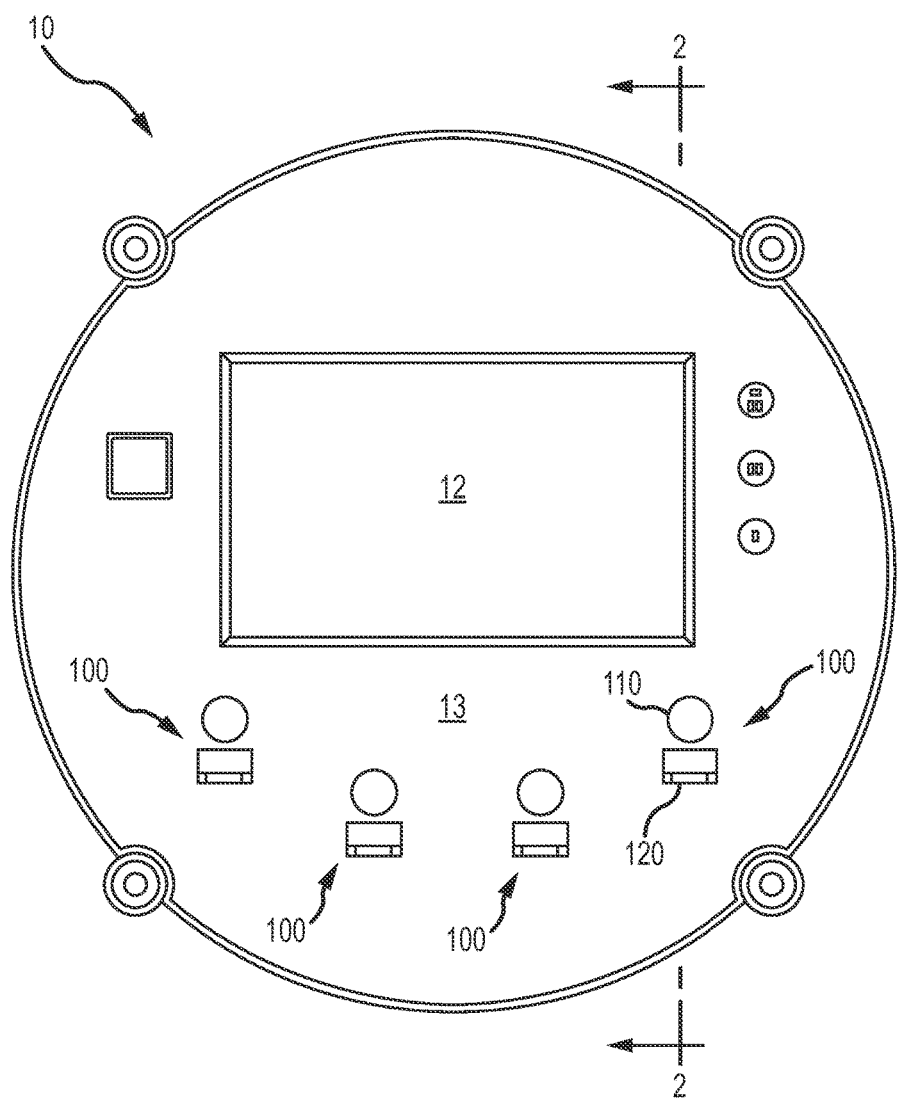
FIG. 1 shows a front plan view of an interface 10 with an adaptive reflected light touch sensor 100 according to an embodiment.

FIG. 1 shows a front plan view of an interface 10 with an adaptive reflected light touch sensor 100 according to an embodiment. The interface 10 is shown with a display 12 and a bezel 13. In the bezel 13, are four adaptive reflected light touch sensors 100 although more or fewer can be employed in alternative embodiments. The adaptive reflected light touch sensor 100 includes an emitter 110. In the embodiment shown, the emitter 110 is an infrared light emitting diode (IR LED) although any suitable emitter can be employed. The adaptive reflected light touch sensor 100 also includes a sensor 120 that senses the light emitted by the emitter 110 after the light is reflected, as will be described in more detail in the following.

Figure 2:
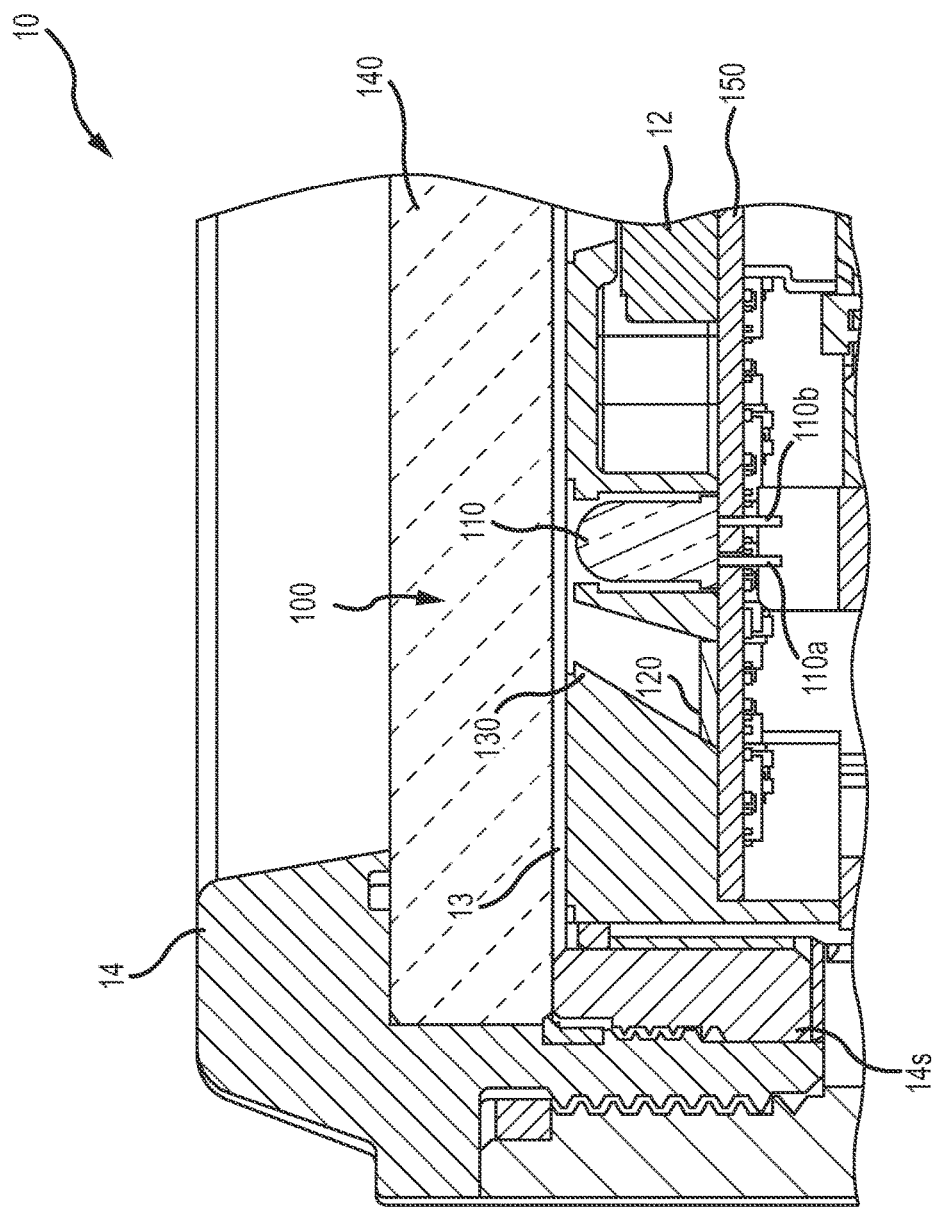
FIG. 2 shows a side cross sectional view, taken at 2-2 in FIG. 1, of the interface 10 with an adaptive reflected light touch sensor 100.

FIG. 2 shows a side cross sectional view, taken at 2-2 in FIG. 1, of the interface 10 with the adaptive reflected light touch sensor 100. As can be seen, the adaptive reflected light touch sensor 100 includes the emitter 110 and the sensor 120 described with reference to FIG. 1. Also shown is a light guide 130 in the bezel 13. The light guide 130 is disposed around the sensor 120 at a first distal end of the light guide 130. The light guide 130 includes a second distal end that is oriented at an angle towards a window 140. In the embodiment shown, the window 140 is disposed proximate to and over the emitter 110 and the sensor 120. The emitter 110 and sensor 120 are coupled to the processor board 150. As shown, the emitter 110 is coupled to the processor board 150 with two leads 110a, 110b. The display 12 described with reference to FIG. 1 is also coupled to the processor board 150. The interface 10 includes a cover 14 that is coupled to a spacer 14s. The spacer 14s holds the window 140 spaced apart from the emitter 110 and the sensor 120.

In the embodiment of FIG. 2, the emitter 110 and the sensor 120 are proximate to and substantially coplanar with each other. In alternative embodiments, the emitter 110 and the sensor 120 may not be proximate to each other or substantially coplanar. For example, the sensor 120 could be oriented at an angle relative to the emitter 110. Accordingly, the emitter 110 can emit light in a direction that reflects the light. Orienting the sensor 120 may be desirable to, for example, maximize the reflected light that is received by the sensor 120. The emitter 110 and the sensor 120 can also be spaced apart. For example, it may be desirable to couple the emitter 110 to the processor board 150 in a spaced apart relationship with the sensor 120. Additionally or alternatively, the emitter 110 and the sensor 120 can be coupled to different processor boards. In these and other embodiments, the sensor 120 receives the light reflected by the window 140.

In the embodiment shown, the window 140 has a flat and circular shape that is comprised of a transparent material, such as glass, although any suitable shapes and materials can be employed. In alternative embodiments, the window 140 can be comprised of other materials, such as a composite of materials. In these and other embodiments, the window 140 can reflect one or more portions of the light emitted by the emitter 110 towards the sensor 120, as will be explained in more detail in the following with reference to FIG. 3. In other embodiments, the window 140 may not be employed. For example, the light may be reflected by something other than the window 140, such as the bezel 13 or scattering by the ambient environment. Accordingly, a small or even negligible amount of light may be reflected. These and other reflected light can be received by the sensor 120 coupled to the processor board 150.

The processor board 150 is capable of configuring the adaptive reflected light touch sensor 100. For example, the processor board 150 can be a printed circuit board (PCB) that includes memory, one or more processors, cabling, or the like (not shown) that are capable of, alone or in combination, configuring the adaptive reflected light touch sensor 100. For example, the one or more processors in the processor board 150 can execute a program comprised of one or more codes that reads and alters data, sends and receives signals, communicates with other processor boards, or the like. In these and other embodiments, the processor board 150 can configure the adaptive reflected light touch sensor 100 to detect a true button press, as will be described in more detail in the following.

Figure 3:
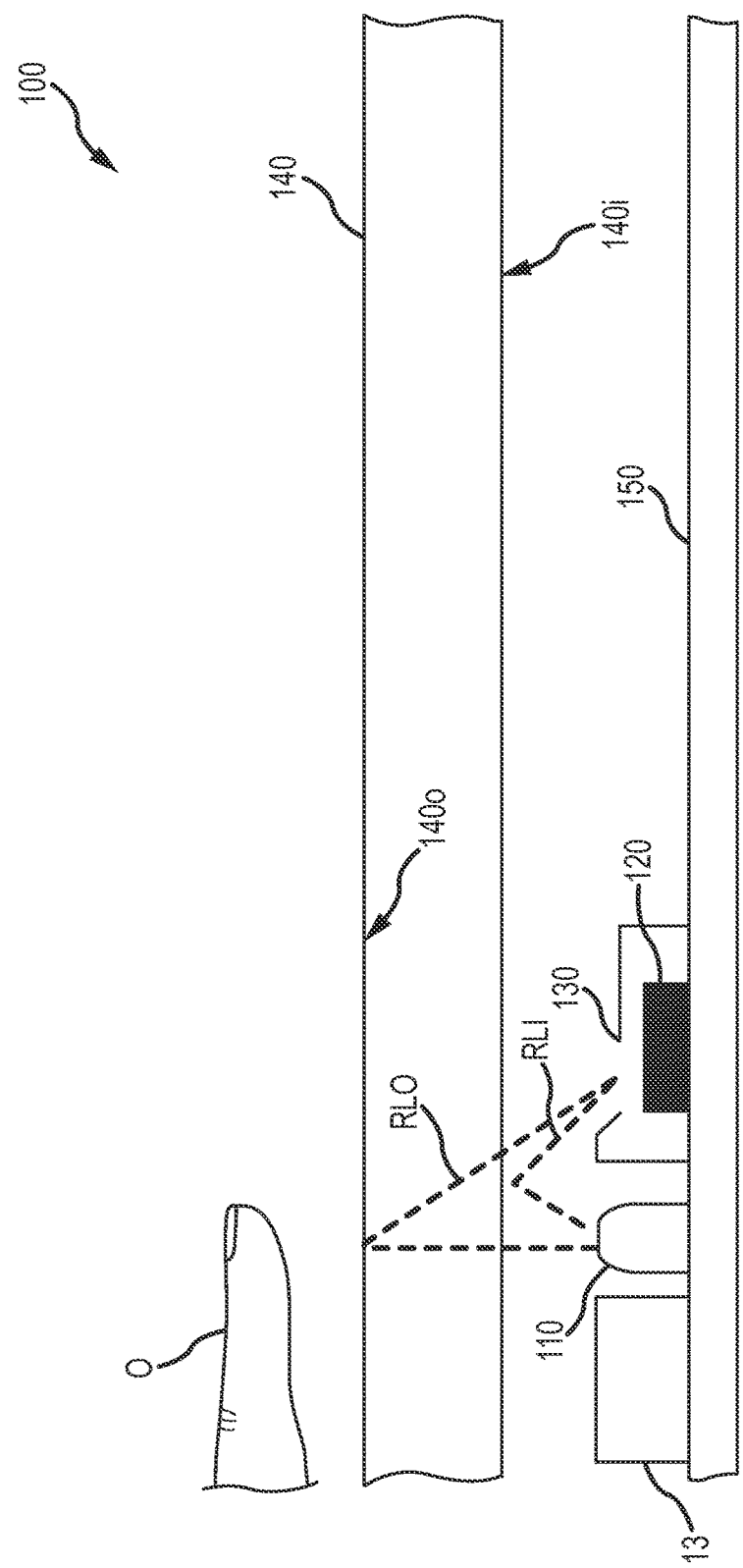
FIG. 3 shows a side view of a simplified representation of the adaptive reflected light touch sensor 100.

FIG. 3 shows a side view of a simplified representation of the adaptive reflected light touch sensor 100. The light from the emitter 110 is reflected by the window 140. As shown, the light is reflected by the inner window surface 140i and the outer window surface 140o. The reflected light RLI from the inner window surface 140i and the reflected light RLO from the outer window surface 140o are shown as exemplary single light paths but could be any other light path. Although not shown in FIG. 3, the spacer 14s described with reference to FIG. 2, holds the window 140 spaced apart from the emitter 110 and the sensor 120. An operator O's finger is shown as proximate the outer window surface 140o. Although not shown, the light from the emitter 110 can also be reflected by the operator O's finger towards the sensor 120.

Parameters in the adaptive reflected light touch sensor 100 can vary due to factors such as environmental conditions, part tolerances, and electrical power. For example, the distances between the surfaces 140i, 140o and the emitter 110 and sensor 120 can vary on a product-by-product basis. The proportion of the light reflected by the window 140 can also vary on the product-by-product basis. Additionally or alternatively, a light amplitude (e.g., intensity, brightness, etc.) from the emitter 110 can also vary, even within the same product. In some embodiments, the light amplitude can correspond with environmental factors such as an ambient temperature. When the ambient temperature increases, the light amplitude can decrease. Fluctuations in the electrical power supplied to the emitter 110 by the processor board 150 can also cause variations in the light amplitude from the emitter 110. These and other variations in the parameters can cause the light amplitude of the reflected light RLI, RLO as well as the light reflected by the operator O's finger to vary. As will be described in more detail in the following, detecting the operator O's finger is not affected by these variations.

Figure 4:
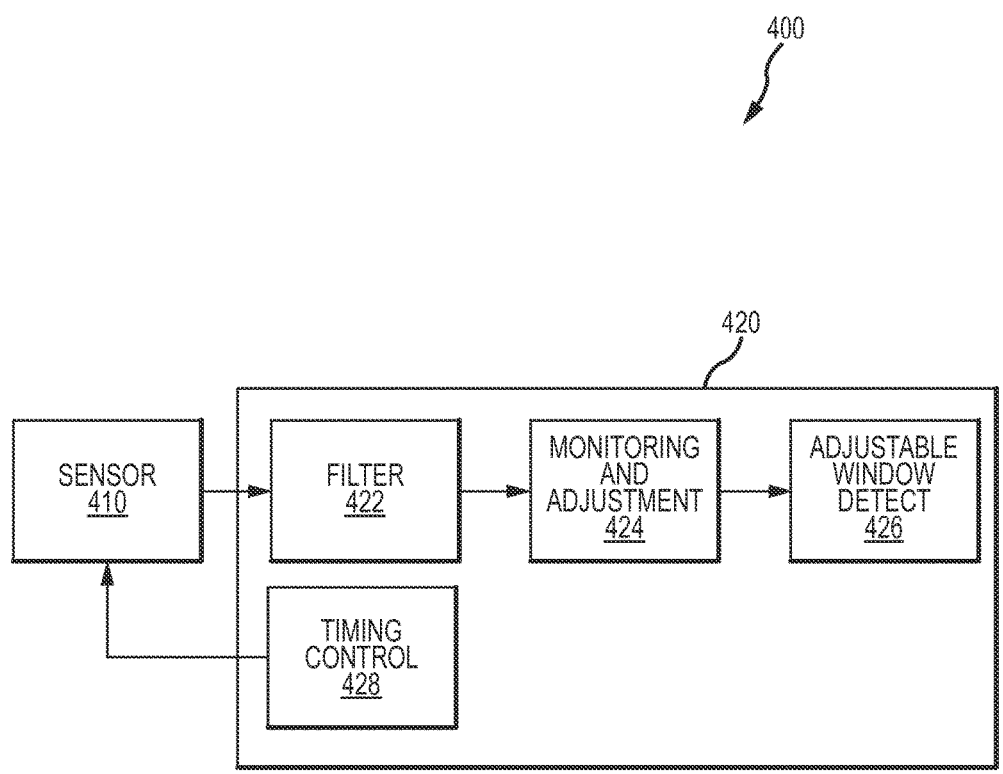
FIG. 4 shows a block diagram representation of an adaptive reflected light touch sensor 400 according to an embodiment.

FIG. 4 shows a block diagram representation of an adaptive reflected light touch sensor 400 according to an embodiment. The adaptive reflected light touch sensor 400 includes block representations of exemplary components and functions described in the foregoing with reference to FIGS. 1-3. The adaptive reflected light touch sensor 400 can also represent other embodiments. As shown, the adaptive reflected light touch sensor 400 includes a sensor 410 coupled to a processor 420. The sensor 410 can represent the sensor 120 described with reference to FIGS. 2 and 3. The processor 420 can represent one or more processors on the processor board 150 described with reference to FIGS. 2 and 3. The processor 420 is shown as having a filter 422, monitoring and adjustment block 424, and an adjustable window detect block 426. The processor 420 also includes a timing control 428 that is coupled to the sensor 410.

The sensor 410 detects the light reflected by the window 140 and the operator O's finger. The light reflected by the window 140 can be the same as the reflected light RLI, RLO described in the foregoing with reference to FIG. 3 or any other reflected light. In the embodiment shown, the sensor 410 is a photo-electric sensor that converts the light amplitude into an electrical signal. The electrical signal can correlate with the light amplitude. For example, the voltage of the electrical signal may have linear correlation with light amplitude. That is, for every unit increase in the light amplitude, there is a corresponding unit increase in the voltage of the electrical signal. Other parameters of the electrical signal can correlate with the light amplitude. In the embodiment shown, the electrical signal is sent to the filter 422.

The filter 422 removes noise from the electrical signal. For example, the electrical signal might include, due to cross talk or other undesired couplings, transient fluctuations with high frequency components. Accordingly, the filter 422 can be a low pass filter with a cut-off frequency that is lower than the high frequency components. The cut-off frequency can also be greater than the highest frequency expected from the electrical signal. For example, the electrical signal might be a direct current (DC) electrical signal with a voltage that correlates with the measured light amplitude. The low pass filter could remove undesirable high frequency components while allowing the DC electrical signal with the voltage that correlates with the measured light amplitude to be communicated to the monitoring and adjustment block 424.

The monitoring and adjustment block 424 performs an average adjustment of the electrical signal provided by the filter 422. The monitoring and adjustment block 424 can be a digital circuit that receives the electrical signal. The electrical signal can be compared against an assert threshold to determine if an assert occurred. The assert typically occurs when the electrical signal exceeds the assert threshold. For example, the assert threshold can be a voltage level that is exceeded by the electrical signal. The monitoring and adjustment block 424 can also adjust a moving average of the measured light amplitudes. The monitoring and adjustment block 424 can send the electrical signal, measured light amplitudes, and/or asserts to the adjustable window detect block 426.

In the adjustable window detect block 426, the asserts can be compared against a button press threshold to register a true button press. The true button press is where the operator O is pressing against the window 140. The true button press will have associated characteristics such as a corresponding increase in the measured light amplitude. These and other characteristics can be measured by the adaptive reflected light touch sensor 100 to register the true button press, as will be described in the following.

Figure 5:
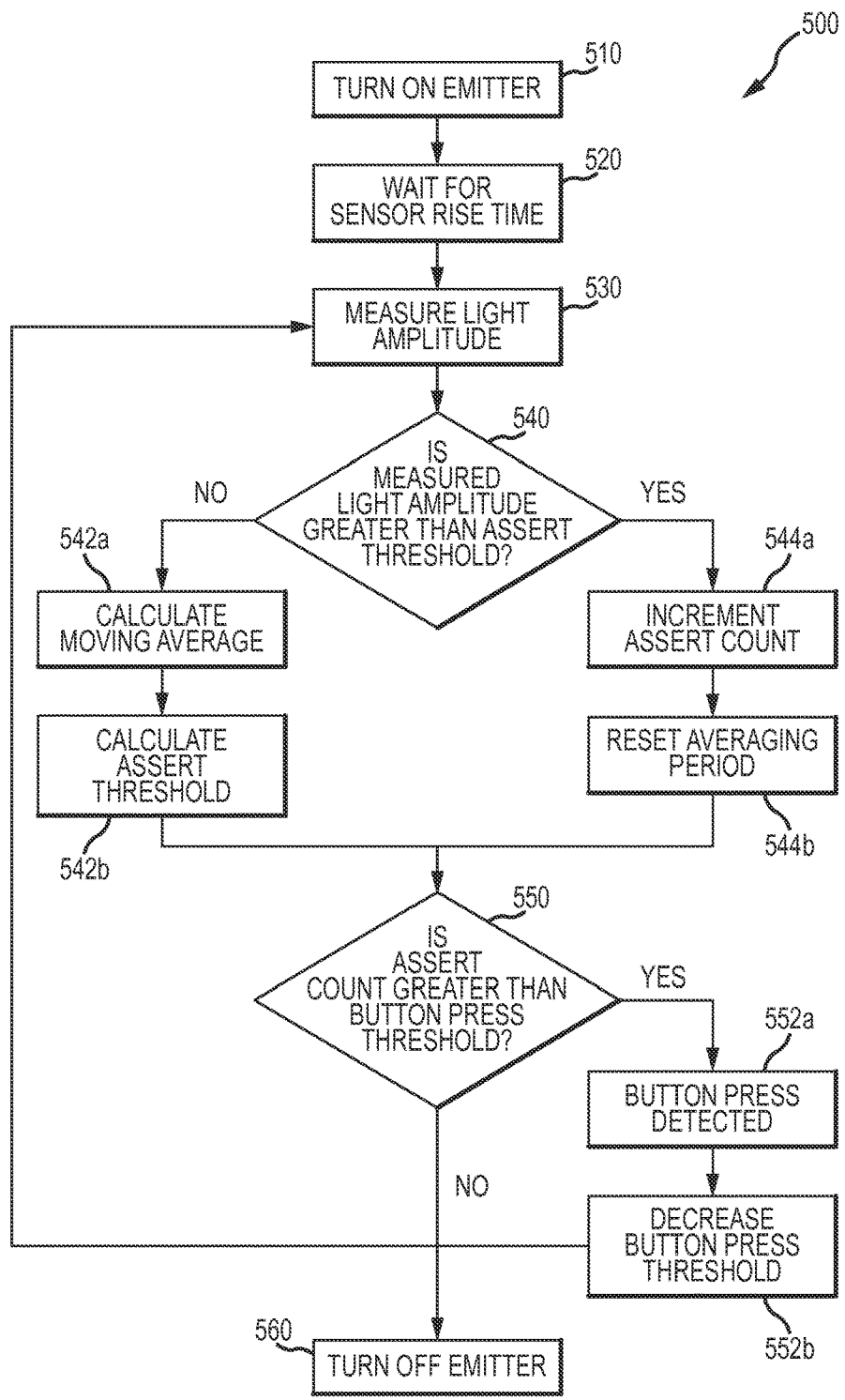
FIG. 5 shows a method 500 of adapting the adaptive reflected light touch sensor 100, 400 according to an embodiment.

FIG. 5 shows a method 500 of configuring the adaptive reflected light touch sensor 100, 400 according to an embodiment. The method 500 begins with step 510, which turns on the emitter 110. In the embodiment shown, the emitter is an infrared (IR) emitter. After step 510, the method 500 waits for the sensor 120, 410 rise time in step 520. Once the sensor 120, 410 rise time is completed, the method, in step 530, measures the light amplitude of the reflected light RLI, RLO. The measured light amplitude can be compared to the assert threshold in step 540. If the comparison indicates that the measured light amplitude is less than the assert threshold, then the method 500 calculates a moving average in step 542*a* and calculates the assert threshold in step 542*b*. If the comparison indicates that the measured light reflection is greater than the assert threshold, then an assert count is incremented in step 544*a* and an averaging period is reset in step 544*b*.

Continuing with the method 500, the assert count is compared with the button press threshold in step 550. If the comparison indicates that the assert count is greater than the button press threshold, then a true button press is detected in step 552*a* and the button press threshold is decreased in step 552*b* to implement button hysteresis. In step 550, the method 500 can loop back to measure the light amplitude in step 530. If data is no longer required, then the emitter 110 can be turned off in step 560. Exemplary details of each step in the method 500, such as the moving average, button press threshold, assert count, and averaging period, are described with more detail in the following.

Step 510, which turns on the emitter 110, can occur when the interface 10 receives a command to accept input from the operator O. For example, a remote controller (not shown) might be in communication with the interface 10. The remote controller might ordinarily transmit data to the interface 10. In some situations, such as when local control of a vibratory meter is desired, the interface 10 might receive a command from the remote controller to accept data from the interface 10. This command can cause the interface 10 to supply power to the emitter 110. After receiving power, the method 500 can wait for the sensor rise time in step 520.

Step 520 might include waiting for the sensor's 120, 410 electrical signal to increase to a steady state value. Step 520 may be required for certain kinds of emitters 110. For example, the light amplitude from the emitter 110 will increase to a steady state after the emitter 110 receives power. Since the sensor 120, 410 is detecting the light amplitude of the reflected light, the sensor 120, 410 will also have a rise time. Other factors can also cause the sensor 120, 410 rise time. Accordingly, these factors may not affect the measurements that occur after step 520.

In step 530, the sensor 120, 410 can receive the light reflected by the window 140. The sensor 120, 410 can also receive the light reflected by the operator O's finger. The sensor 120, 410 generates an electrical signal that is communicated to the processor board 150 by the pins 122*a,b*. The electrical signal may be proportional to the light amplitude received by the sensor 120, 410. The electrical signal can be referred to as the measured light amplitude. The measured light amplitude can be greater if the reflected light includes light reflected by the operator O's finger. With this understanding, the measured light amplitude can be compared with the assert threshold.

In step 540, the measured light amplitude can be compared with the assert threshold to determine if an assert occurred. In the embodiment shown, the comparison is whether the measured light amplitude is greater than the assert threshold. For example, the voltage of the electrical signal from the sensor 120, 410 can be compared with the voltage of the assert threshold. If the comparison indicates an assertion is made, the method 500 updates the moving average in step 542*a* and calculates the assert threshold in step 542*b*.

In step 542*a*, the moving average of the measured light amplitude is updated with the most recent measured light amplitude determined in step 530. The moving average can be an average voltage amplitude of the electrical signal from the sensor 120, 410. That is, in this embodiment, the moving average is the sum of the voltage amplitudes divided by a sample size. The sample size is the number of voltage amplitudes that are added together for the moving average. The sample size can be predetermined, adaptive, or change within the method 500. In the embodiment of the method 500, the most recent light amplitude measurement is added to the sample and the oldest light amplitude measurement is dropped from the sample. After the moving average is updated, the assert threshold can be recalculated.

In step 542*a*, the updated moving average can be used to calculate the assert threshold. The assert threshold is a calculated dynamic value based on the moving average of the measured light amplitudes. For example, the assert threshold can be proportional to a scalar value added to the moving average. The assert threshold can also be based on other factors such as the sensitivity of each adaptive reflected light touch sensor 100, 400. The sensitivity of each adaptive reflected light touch sensor 100, 400 can be correlated with the light amplitude emitted by the emitter 110, sensitivity of the sensor 120, 410, transparency of the window 140, or the like.

In step 540, if the measured light amplitude is greater than the assert threshold, then the method 500 increments the assert count in step 544*a* and resets the averaging period in step 544*b*. In step 544*a*, the assert count is incremented to count the number of asserts that occurred within a sliding detection window. The sliding detection window has a configurable size. For example, the sliding detection window can be the four most recent measured light amplitudes. After incrementing the assert count in step 544*a*, the method 500 resets the averaging period in step 544*b*.

In step 544*b*, the method 500 does not update the moving average with the latest measured light amplitude. The latest measured light amplitude includes light reflected by the operator O's finger in addition to the light reflected RLI, RLO by the window 140. The moving average is an average of the light reflected RLI, RLO by the window 140. Accordingly, the moving average is not updated with the measured light amplitudes that are counted as asserts due to the measured light amplitudes including the light reflected by the operator O's finger. In step 544*b*, the averaging period is reset to include the measured light amplitudes that do not include the light reflected by the operator O's finger.

In step 550, the method 500 determines the true button press occurred if the assert count is greater than the button press threshold. If the comparison indicates that the button press has not occurred, then the method 500 can loop back to step 530 to measure the light reflection. If the comparison between the assert count and the button press threshold indicates that the button press threshold is exceeded, then the method 500 continues to step 552*a* to detect the button press.

In step 552*a*, the monitoring and adjustment block 424 can detect the true button press to perform functions associated with the true button press. For example, the true button press can be associated with a menu select function. The menu select function can be a selection of a highlighted item in the menu. The display 12 could display the menu item to the operator O. The operator O can scroll through the menu to highlight items in the menu. The scroll functions may be associated with the other adaptive reflected light touch sensor 100 described with reference to FIG. 1.

In step 552*b*, a button hysteresis is implemented to accurately detect the button press. Button hysteresis refers to the asymmetric properties of the button press threshold. For example, more asserts may be required to register the true button press than are required for maintaining the registered true button press. The button hysteresis can be implemented by changing the button press threshold after the true button press is registered. For example, four asserts within the sliding detection window may be required to register the true button press. Subsequently, the method 500 may reduce the number of asserts required to maintain the true button press to, for example, two asserts.

From step 552b, the method 500 may end by turning off the emitter 110 in step 560. The method 500 may turn off the emitter 110 in step 560 when the operator O or the remote controller sends a command to the interface 10 to stop accepting data from the interface 10. The method 500 can also return to step 530 where the light amplitude can be measured and added to the samples as described in the foregoing or alternative embodiments. Exemplary embodiments of the measurement samples as well as the assert and button press thresholds and the moving average are described in the following with reference to FIG. 6.

Figure 6:
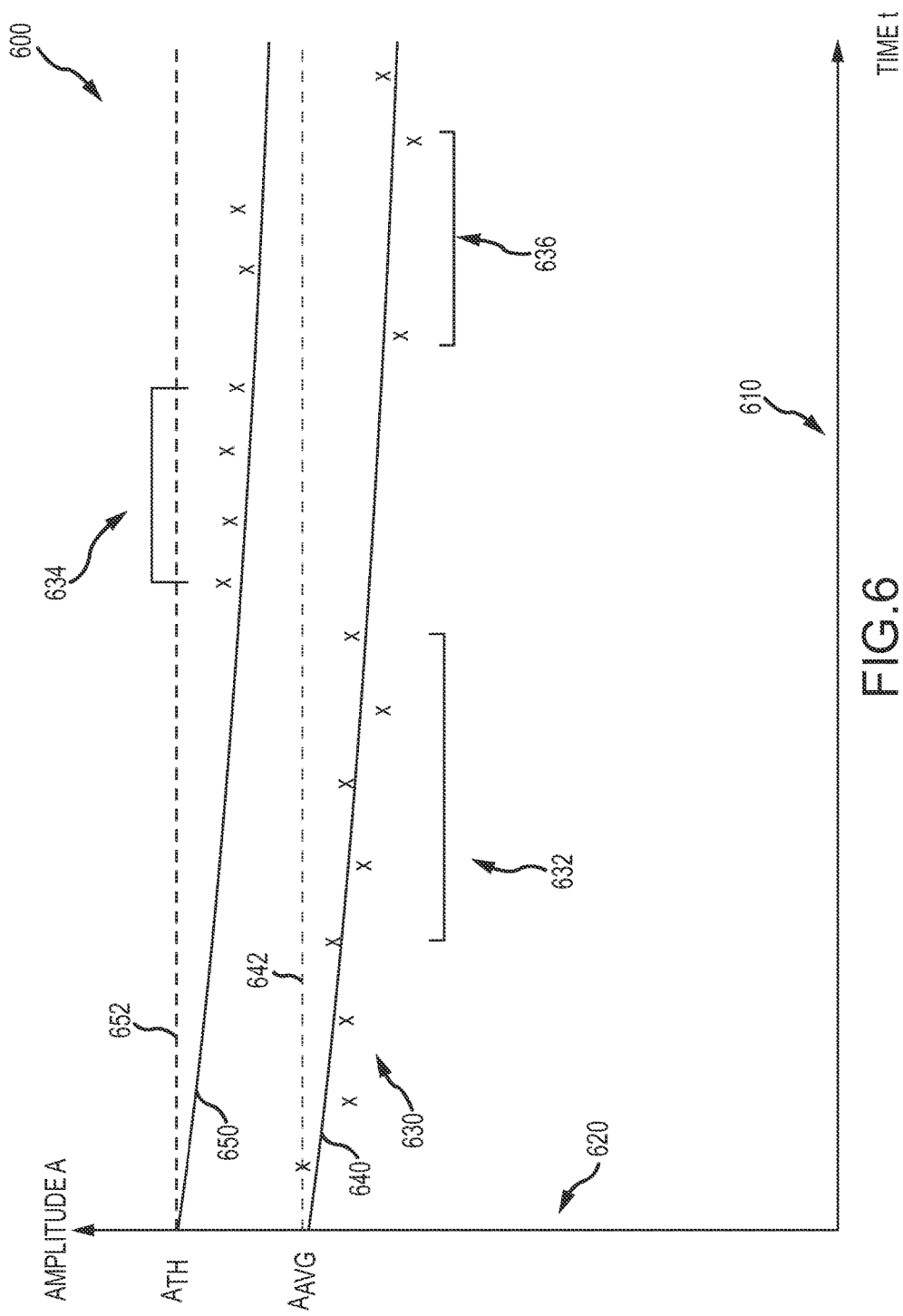
FIG. 6 shows a graph 600 with a time t axis 610 and an amplitude A axis 620 and a group of waveforms.

FIG. 6 shows a graph 600 with a time t axis 610 and an amplitude A axis 620 and a group of waveforms. The graph 600 includes measured light amplitudes 630. The measured light amplitudes 630 are a series of data points denoted as 'x' in the graph 600. The graph 600 also includes a moving average 640 designated by an '$A_{AVG}$' and an assert threshold 650 designated by an '$A_{TH}$'. The measured light amplitudes 630 are shown as occurring sequentially over time t.

The measured light amplitudes 630 can be samplings of the electrical signal that is provided by the sensor 120, 410 to the monitoring and adjustment block 424. The measured light amplitudes 630 can be in units of amplitude A. The amplitude A can be in any appropriate units such as the DC voltage amplitude of the electrical signal provided by the sensor 120, 410, the light amplitude of the light received by the sensor 120, 410, or the like. The amplitude A shown in the graph 600 is in units of volts which is the direct current voltage amplitude of the electrical signal provided by the sensor 120, 410. As described in the foregoing with reference to FIG. 5, the moving average 640 and the assert threshold 650 can be calculated from the measured light amplitudes 630.

As can be seen in the graph 600, the moving average 640 and the assert threshold 650 are trending down. The moving average 640 and the assert threshold 650 can be trending down from their initial values 642, 652 due to being calculated from the measured light amplitudes 630. The measured light amplitudes 630 could also be trending down for a variety of reasons such as, for example, an ambient temperature increase. The ambient temperature increase can cause the radiant intensity of the emitter 110 to decrease. Accordingly, the measured light amplitudes 630 decrease over time. In alternative embodiments, the moving average 640 and the assert threshold 650 can be calculated from measured light amplitudes with any other trends in alternative embodiments. Although some of the measured light amplitude samples shown in the graph 600 appear to not follow the trend for a few samples, such samples are associated with asserts. The moving average 640 may not include these samples, as will be explained in more detail in the following.

The moving average 640 can be calculated from the measured light amplitudes 630 that are not above the assert threshold 650. For example, shown in FIG. 6 is an exemplary moving average set 632 comprised of five measured light amplitudes 630. The moving average set 632 is shown as sequential measured light amplitudes 630 with the five most recent measured light amplitudes 630. The moving average 640 is calculated from a sum of the moving average set 632 which is divided by the number of measured light amplitudes 630 in the moving average set 632. The moving average set 632 is shown as occurring before a true button press. The true button press shown in FIG. 6 as being comprised of a button press set 634 and a reduced button press threshold set 636.

The button press set 634 is shown as being comprised of four measured light amplitudes 630 that are above the assert threshold 650. These four measured light amplitudes 630 are counted as asserts. In the embodiment shown, the true button press is registered when four sequential asserts are counted. However, in alternative embodiments, more or fewer asserts can comprise the true button press. Additionally or alternatively, a ratio of asserts can be registered as the true button press (e.g., three of five, etc.). Accordingly, the true button press is registered with the most recent measured light amplitude 630 in the button press set 634. The button press set 634 is followed by a reduced button press threshold set 636 comprised of four measured light amplitudes 630. As can be seen, two of the measured light amplitudes 630 are below the assert threshold 650.

The reduced button press threshold set 636 illustrates an exemplary implementation of the button hysteresis. In the embodiment shown, the true button press is still being registered even though two of the measured light amplitudes 630 are below the assert threshold 650. The reduced button press threshold set 636 is shown as requiring only two of the most recent three measured light amplitudes 630 that are over the assert threshold 650. Accordingly, the true button press remains registered even though one of the measured light amplitudes 630 is below the assert threshold 650. The button hysteresis prevents transient events unrelated to the true button press, such as glare, from causing errors.

The graph 600 also illustrates how, according to an embodiment, the moving average 640 may not be updated if the measured light amplitudes 630 are above the assert threshold 650. For example, the moving average 640 does not trend differently during the button press set 634 even though the measured light amplitudes 630 are greater than the assert threshold 650. Instead, the moving average 640 continues to trend downward. As can also be seen, the moving average 640 does not trend differently during the reduced button press threshold set 636 even though two of the measured light amplitudes 630 are above the assert threshold 650.

The foregoing description with respect to FIG. 6 is directed to a single adaptive reflected light touch sensor 100. As can be appreciated, each of the adaptive reflected light touch sensors 100 shown in FIG. 1 can be independently configured, as will be discussed in the following with reference to FIG. 7.

FIG. 7 shows a graph 700 with a time t axis 710, an amplitude A axis 720 and a waveform 730. The waveform 730 represents the reflected light magnitude of four adaptive reflected light touch sensors 100 measured over time. As shown, the waveform 730 is comprised of four sensor measurements 730a to 730d. Also shown in FIG. 7 are four assert thresholds 740a to 740d. The four assert thresholds 740a to 740d have different values. Although four sensor measurements 730a to 730d and four assert thresholds 740a to 740d are shown, more or fewer can be employed in alternative embodiments where, for example, alternative interfaces employ more or fewer adaptive reflected light touch sensors 100.

In the embodiment of FIG. 7, the four sensor measurements 730a to 730d and the four assert thresholds 740a to 740d correspond to the four adaptive reflected light touch sensors 100 shown in FIG. 1. For example, the first sensor measurement 730a can correspond with the first adaptive reflected light touch sensor 100 on the right side of the interface 10 shown in FIG. 1. The other three sensor measurements 730b to 730d can correspond to the other three adaptive reflected light touch sensors 100 shown in FIG. 1. More particularly, moving to the left in FIG. 1, the remaining three adaptive reflected light touch sensors 100 can be referred to as the second, third, and fourth adaptive reflected light touch sensors 100.

The waveform 730 shown in FIG. 7 can be generated by sequentially measuring the reflected light magnitude from each of the adaptive reflected light touch sensors 100 shown in FIG. 1. For example, an analog-to-digital converter (A/D converter) could be coupled to the first adaptive reflected light touch sensor 100 to form the first sensor measurement 730a and then coupled to a second adaptive reflected light touch sensor 100 to form the second sensor measurement 730b. The third and fourth adaptive reflected light touch sensors 100 can also be measured to generate the third and fourth sensor measurements 730c and 730d. Other measurement techniques can be employed to illustrate the independent configuration of the four adaptive reflected light touch sensors 100 shown in FIG. 1.

As can be appreciated from FIG. 7, the second adaptive reflected light touch sensor 100 is being pressed. The first, third, and fourth adaptive reflected light touch sensors 100 are not being pressed. As a result, the second sensor measurement 730b is greater than the corresponding second assert threshold 740b. The second sensor measurement 730b, therefore, is counted as an assert whereas the other three sensor measurements 730a, 730c, and 730d are not. The other three sensor measurements 730a, 730c, and 730d are from the light reflected by the window 140, other object, the ambient environment, or the like but do not include light reflected by, for example, the operator's finger. Such reflected light are not registered as an assert.

FIG. 7 also shows that the measured reflected light amplitude of each adaptive reflected light touch sensor 100 can be different. For example, the first sensor measurement 730a has a measured reflected light amplitude that is less than, for example, the third sensor measurement 730c. This can be due to various factors such as the reflectivity of the window 140 being greater near the third adaptive reflected light touch sensor 100. In addition, the assert thresholds 740a to 740d can also be different. For example, the first assert threshold 740a is less than the second assert threshold 740b. This can be due to the independent calculation of the moving average and assert thresholds for each of the adaptive reflected light touch sensors by, for example, the processor board 150.

Accordingly, a true button press can feel consistent to the operator even though different adaptive light touch sensors 100 are pressed by the operator. For example, a consistent press by the operator on each of the buttons may cause the same increase in the measured reflected light amplitude. Since the increase in the measured light amplitudes can be the same, the number of assert counts that register the true button press can be consistent between different adaptive reflected light touch sensors 100. As a result, when the operator consistently presses the different adaptive reflected light touch sensors 100, the registered button presses can also be consistent. Different adaptive reflected light touch sensors 100 can therefore feel the same despite variations in parts, environment and other factors that affect the reflected light RLI, RLO.

The embodiments described above provide an adaptive reflected light touch sensor 100, 400. As explained above, the adaptive reflected light touch sensor 100, 400 can sense light reflected from the window 140 or other objects. The adaptive reflected light touch sensor 100, 400 can be configured to convert the sensed reflected light to the measured light amplitude. The measured light amplitude can be used to calculate the moving average 640 and the assert threshold 650. The adaptive reflected light touch sensor 100 can also adjust the assert threshold 650 based on a moving average 640. The moving average 640 can be based on the measured light amplitudes 630 of the reflected light RLI, RLO. If, for example, the emissions of the emitter 110 decreases due to an increase in ambient temperature, the moving average 640 will also decrease. In some embodiments, the measured light amplitude may be negligible due to, for example, the window 140 not being employed. Regardless of the cause of the change in the measured light amplitude, the assert threshold 650 can similarly change (e.g., decrease). Accordingly, even though the emissions of the emitter 110 or the amount of reflected light changed, the adaptive reflected light touch sensor 100, 400 can correctly register the true button press.

Additionally or alternatively, the adaptive reflected light touch sensor 100, 400 can have configurable thresholds that can correctly register the true button press. For example, the button press threshold can be configured to increase or decrease the number of asserts required to register the true button press. In another example, the size of the sliding window can be reduced to decrease the number of asserts that are required to register the true button press. The adaptive reflected light touch sensor 100, 400 can also include the button hysteresis to ensure that erroneous measured light amplitudes 630 do not register as the end of the true button press. Accordingly, the adaptive reflected light touch sensor 100, 400 can feel more consistent to the operator O. In addition, objects on or near the window 140, such as debris or water droplets, may not cause a sufficient number of asserts to register as the true button press. Accordingly, erroneous data through the interface 10 may be reduced or eliminated.

The detailed descriptions of the above embodiments are not exhaustive descriptions of all embodiments contemplated by the inventors to be within the scope of the present description. Indeed, persons skilled in the art will recognize that certain elements of the above-described embodiments may variously be combined or eliminated to create further embodiments, and such further embodiments fall within the scope and teachings of the present description. It will also be apparent to those of ordinary skill in the art that the above-described embodiments may be combined in whole or in part to create additional embodiments within the scope and teachings of the present description.

Thus, although specific embodiments are described herein for illustrative purposes, various equivalent modifications are possible within the scope of the present description, as those skilled in the relevant art will recognize. The teachings provided herein can be applied to other adaptive reflected light touch sensors, and not just to the embodiments described above and shown in the accompanying figures. Accordingly, the scope of the embodiments described above should be determined from the following claims.

We claim:

1. An adaptive reflected light touch sensor comprising:
   a window;
   an emitter configured to emit light in a direction that reflects the light from the window positioned to reflect the light and an object that is one of proximate to and pressed against an outer surface of the window;
   a sensor positioned to measure a light amplitude of the reflected light; and a processor board coupled to the sensor, the processor board being configured to:
  determine an assert threshold;
  if the measured light amplitude is less than the assert threshold, then:
    calculate a moving average of the measured light amplitude of the reflected light by averaging two or more of the most recent measured light amplitudes in an averaging period; and
    calculate the assert threshold based on the moving average;
  if the measured light amplitude is greater than the assert threshold, then increment an assert count;
  determine a button press threshold; and
  if the assert count is greater than the button press threshold, then:
    detect a button press; and
    decrease the button press threshold to implement button hysteresis.

2. The adaptive reflected light touch sensor of claim 1, wherein the light reflected by the window is reflected from an outer surface and an inner surface of the window.

3. The adaptive reflected light touch sensor of claim 1, further comprising a gap that is formed by:
  an inner surface of the window; and
  an outer surface of a bezel.

4. The adaptive reflected light touch sensor of claim 1, wherein the window comprises glass.

5. The adaptive reflected light touch sensor of claim 1, further comprising a light guide that directs the reflected light towards the sensor.

6. The adaptive reflected light touch sensor of claim 1, wherein the light is infrared light.

7. A method for configuring an adaptive reflected light touch sensor, the method comprising:
  emitting light from an emitter;
  positioning a window to reflect the light;
  reflecting the light with a window and an object that is one of proximate to and pressed against an outer surface of the window;
  measuring a light amplitude of the reflected light with a sensor;
  determining an assert threshold;
  if the measured light is less than the assert threshold, then;
    calculating a moving average of the measured amplitude of the reflected light; and
    calculating the assert threshold; and
    if the measured light amplitude of the reflected light is greater than the assert threshold, then incrementing an assert counts
  setting a button press threshold to an initial value; and
  if the assert count is greater than the button press threshold, then:
    detecting a button press; and
    decreasing the button press threshold to implement button hysteresis.

8. The method for configuring the adaptive reflected light touch sensor of claim 7, wherein reflecting the light with the window comprises reflecting the light with an outer surface and an inner surface of the window.

9. The method for configuring the adaptive reflected light touch sensor of claim 7, further comprising reflecting the light through a gap that is formed by an inner surface of the window and an outer surface of a bezel.

10. The method for configuring the adaptive reflected light touch sensor of claim 7, wherein the window is comprised of glass.

11. The method for configuring the adaptive reflected light touch sensor of claim 7, further comprising directing the reflected light towards the sensor with a light guide.

12. The method for configuring the adaptive reflected light touch sensor of claim 7, wherein the light is infrared light.

13. An interface comprising:
  two or more adaptive reflected light touch sensors, each of the two or more adaptive reflected light touch sensors comprising:
    a window;
    an emitter configured to emit light in a direction that reflects the light from the window positioned to reflect the light and an object that is one of proximate to an pressed against an outer surface of the window; and
    a sensor positioned to measure a light amplitude of the reflected light; and
  a processor board coupled to the two or more sensors, the processor board being configured to:
    determine an assert threshold; and
    if the measured light amplitude is less than the assert threshold, then:
      calculate a moving average of the measured light amplitude of the reflected light by averaging two or more of the measured light amplitudes; and
      calculate the assert threshold based on the moving average, and
    if the measured light amplitude is greater than the assert threshold, then increment an assert count;
    determine a button press threshold; and
    if the assert count is greater than the button press threshold, then:
      detect a button press; and
      decrease the button press threshold to implement button hysteresis;
  wherein the processor board independently calculates the moving average of the measured light amplitude for each of the two or more adaptive reflected light touch sensors.

* * * * *

UNITED STATES PATENT AND TRADEMARK OFFICE
CERTIFICATE OF CORRECTION

PATENT NO. : 10,394,388 B2
APPLICATION NO. : 15/307991
DATED : August 27, 2019
INVENTOR(S) : Brian T Smith and Chris E. Eyre Page 1 of 1

It is certified that error appears in the above-identified patent and that said Letters Patent is hereby corrected as shown below:

In the Claims

Column 13, Line 50, replace "counts" with --count;--

Signed and Sealed this
Second Day of June, 2020

Andrei Iancu
*Director of the United States Patent and Trademark Office*